(12) United States Patent
Lim et al.

(10) Patent No.: US 10,045,447 B1
(45) Date of Patent: Aug. 7, 2018

(54) CIRCUIT BOARD ARCHITECTURE FOR AN ELECTRONIC DEVICE

(71) Applicant: Google LLC, Mountain View, CA (US)

(72) Inventors: David Kyungtag Lim, Glenview, IL (US); Jason Edward Jordan, Burlingame, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/872,238

(22) Filed: Jan. 16, 2018

Related U.S. Application Data (63) Continuation of application No. 15/424,466, filed on Feb. 3, 2017, now Pat. No. 9,900,999.

(51) Int. Cl.
| | | |
|---|---|---|
| *H05K 1/00* | (2006.01) | |
| *H05K 5/00* | (2006.01) | |
| *H04N 5/225* | (2006.01) | |
| *H04R 3/00* | (2006.01) | |
| *H04R 1/02* | (2006.01) | |
| *H05K 7/14* | (2006.01) | |
| *H05K 1/02* | (2006.01) | |
| *H05K 1/14* | (2006.01) | |

(52) U.S. Cl.
CPC ......... *H05K 5/0086* (2013.01); *H04N 5/2256* (2013.01); *H04N 5/2257* (2013.01); *H04R 1/025* (2013.01); *H04R 3/00* (2013.01); *H05K 1/028* (2013.01); *H05K 1/14* (2013.01); *H05K 7/1427* (2013.01); *H04R 2499/11* (2013.01); *H05K 2201/04* (2013.01)

(58) Field of Classification Search
CPC ........ H05K 5/0086; H05K 1/14; H05K 1/028; H05K 7/1427; H05K 2201/04; H04R 3/00; H04R 2499/11

USPC .......................................................... 174/254
See application file for complete search history.

(56) References Cited

U.S. PATENT DOCUMENTS

| | | |
|---|---|---|
| 5,384,690 A | 1/1995 | David et al. |
| 2006/0050492 A1 | 3/2006 | Goodwin et al. |
| 2010/0062656 A1 | 3/2010 | Lynch et al. |
| 2010/0091451 A1 | 4/2010 | Hendren et al. |

(Continued)

FOREIGN PATENT DOCUMENTS

| | | |
|---|---|---|
| EP | 1879363 | 1/2008 |
| EP | 2518979 | 10/2012 |
| WO | WO 2012/024578 | 2/2012 |

OTHER PUBLICATIONS

'eandt.theiet.org' [online] "Huawei P9 smartphone: tech spec and teardown," Oct. 7, 2016, [retrieved on Feb. 3, 2017] Retrieved from Internet: URL<https://eandt.theiet.org/content/articles/2016/09/huawei-p9-smartphone-tech-spec-and-teardown/> 8 pages.

(Continued)

*Primary Examiner* — Sherman Ng
(74) *Attorney, Agent, or Firm* — Fish & Richardson P.C.

(57) ABSTRACT

An electronic device is provided. In some embodiments, the electronic device includes an electronic device housing having a major planar face, first and second circuit boards oriented parallel to the major planar face, a third circuit board electrically connected with the first and second circuit boards, and a battery partially surrounded by the first, second, and third circuit boards. At least a portion of the third circuit board is oriented perpendicular to the major planar face between the first and second circuit boards.

18 Claims, 4 Drawing Sheets

(56) References Cited

U.S. PATENT DOCUMENTS

| | | | |
|---|---|---|---|
| 2012/0044637 A1 | 2/2012 | Rothkopf et al. | |
| 2013/0127560 A1* | 5/2013 | Kato | H05K 1/0225 333/12 |
| 2013/0258575 A1 | 10/2013 | Rothkopf et al. | |
| 2014/0170907 A1 | 6/2014 | Golko et al. | |
| 2014/0184057 A1 | 7/2014 | Kim et al. | |
| 2014/0295921 A1* | 10/2014 | Kato | H04M 1/026 455/575.1 |
| 2015/0062844 A1 | 3/2015 | Bae et al. | |
| 2015/0087353 A1 | 3/2015 | Yosui | |
| 2015/0162684 A1 | 6/2015 | Amini et al. | |
| 2016/0079663 A1 | 3/2016 | Youm et al. | |
| 2016/0270211 A1* | 9/2016 | Yosui | H01P 3/08 |

OTHER PUBLICATIONS

'www.androidauthority.com' [online] LG g4 Teardown, Jun. 8, 2015, [retrieved on Feb. 3, 2017] Retrieved from Internet: URL<http://www.androidauthority.com/lg-g4-teardown-614759/> 3 pages.

'www.chipworks.com' [online] "Inside the Samasung Galaxy S6," Apr. 2, 2015 [retrieved on Feb. 3, 2017] Retrieved from Internet URL<https://www.chipworks.com/about-chipworks/overview/blog/inside-the-samsung-galaxy-s6> 10 pages.

'www.fonearena.com' [online] "OnePlus 3 Teardown," [retrieved Feb. 3, 2017] Retrieved from Internet: URL<http://www.fonearena.com/blog/189275/oneplus-3-teardown.html> 14 pages.

'www.ifixit.com' [online] "Google Pixel XL Teardown," Oct. 21, 2016 [retrieved on Feb. 2, 2017] Retrieved from Internet: URL<https://www.ifixit.com/Teardown/Google+Pixel+XL+Teardown/71237> 14 pages.

'www.ifixit.com' [online] "iPhone 7 Plus Teardown," Sep. 15, 2016, [retrieved on Feb. 3, 2017] Retrieved from Internet: URL<https://www.ifixit.com/Teardown/iPhone+7+Plus+Teardown/67384> 30 pages.

'www.ifixit.com' [online] "Motorola Moto X Teardown," Aug. 23, 2013, [retrieved on Feb. 2, 2017] Retrieved from Internet URL<https://www.ifixit.com/Teardown/Motorola+Moto+X+Teardown/16867> 15 pages.

'www.ifixit.com' [online] Samsung Galaxy S7 Teardown, Mar. 8, 2016, [retrieved on Feb. 3, 2017] Retrieved from Internet: URL<https://www.ifixit.com/Teardown/Samsung+Galaxy+S7+Teardown/56686> 17 pages.

'www.padpcb.com' [online] "Flexible Printed Curcuit Manufacturing," 2017 [Retrieved on Feb. 3, 2017] Retrieved from Internet URL<http://www.padpcb.com/flexbile-printed-circuit-manufacturing_p41.html> 4 pages.

'www.szsmtfly.com' [online] "Temperature Resist Acf Tapes for Pulse Heat Bonding Machine LCD," 2016-2017 copyright, [retrieved on Feb. 3, 2017] Retrieved from Internet URL<http://www.szsmtfly.com/sale-8234891-temperature-resist-acf-tapes-for-pulse-heat-bonding-machine-lcd.html> 3 pages.

'www.techinsights.com' [online] "Apple iPhone 7 Teardown," [Retrieved on Feb. 3, 2017} Retrieved from Internet: URLhttp://www.techinsights.com/about-techinsights/overview/blog/apple-iphone-7-teardown/> 24 pages.

International Search Report and Written Opinion issued in International Application No. PCT/US2017/055866, dated Dec. 22, 2017, 16 pages.

* cited by examiner

CIRCUIT BOARD ARCHITECTURE FOR AN ELECTRONIC DEVICE

This application is a continuation of and claims priority to U.S. application Ser. No. 15/424,466, filed on Feb. 3, 2017, the entire contents of which are hereby incorporated by reference.

BACKGROUND

Electronic devices that include a circuit board and other components are well known. Many electronic devices include multiple circuit boards that are positioned inside a housing along with other components, such as a battery. For example, many mobile electronic devices, such as mobile phones, may include top and bottom circuit boards arranged at top and bottom locations within an electronic device housing, and a battery positioned between the top and bottom boards. Various techniques have been employed to electrically connect the top and bottom boards, such as routing a flexible circuit over a major surface of the battery between the top and bottom boards or alongside the battery, and connecting the top and bottom circuit boards via a printed circuit board in a C-shaped or side-board configuration.

SUMMARY

In general, this document describes devices, systems, and methods related to circuit board configurations in electronic devices. Example electronic devices may include first and second circuit boards positioned within an electronic device housing and a third circuit board connecting the first and second circuit boards. The third circuit board may be oriented perpendicular to the first and second circuit boards. Such configurations can provide space savings that allow larger or additional components to be accommodated within the electronic device, such as a larger battery having an improved power capacity. Alternatively or additionally, the overall size of the electronic device may be reduced.

As additional description to the embodiments described below, the present disclosure describes the following embodiments.

Embodiment 1 is an electronic device, comprising: an electronic device housing having a major planar face; a first circuit board and a second circuit board, the first circuit board and the second circuit board each oriented parallel to the major planar face; a third circuit board electrically connected with the first circuit board and the second circuit board, at least a portion of the third circuit board oriented both perpendicular to the major planar face and between the first circuit board and the second circuit board; and a battery at least partially surrounded by the first circuit board, the second circuit board, and the third circuit board on at least three sides, wherein the first circuit board, the second circuit board, and the third circuit board together extend along an entire length of the electronic device housing, and the first circuit board and the second circuit board each extend across an entire width of the electronic device housing.

Embodiment 2 is the electronic device of embodiment 1, wherein the third circuit board is integral to the first circuit board as a unitary circuit board.

Embodiment 3 is the electronic device of embodiment 2, wherein the first circuit board, the second circuit board, and the third circuit board are integrally formed as a unitary circuit board.

Embodiment 4 is the electronic device of any of the preceding embodiments, wherein the third circuit board is a printed circuit board.

Embodiment 5 is the electronic device of any of the preceding embodiments, wherein the third circuit board is a flexible circuit.

Embodiment 6 is the electronic device of any of the preceding embodiments, wherein the first circuit board and the second circuit board are each fixedly positioned with respect to the electronic device housing and separated by a distance (d).

Embodiment 7 is the electronic device of embodiment 6, wherein the third circuit board is oriented vertically over the entire distance (d).

Embodiment 8 is the electronic device of embodiment 6, wherein the third circuit board is oriented vertically over at least half of the distance (d).

Embodiment 9 is the electronic device of embodiment 6, wherein the third circuit board has a length ($l_{board}$) that is greater than the distance (d).

Embodiment 10 is the electronic device of any of the preceding embodiments, wherein the battery has first and second major faces separated by sidewalls, and the first major face and the second major face are oriented parallel to the first circuit board and the second circuit board.

Embodiment 11 is the electronic device of any of the preceding embodiments, wherein the electronic device housing includes first, second, third, and fourth outer sidewalls extending perpendicular from the major planar face, the electronic device having a length ($L_{housing}$) between the first outer sidewall and the second outer sidewall of the electronic device housing.

Embodiment 12 is the electronic device of embodiment 11, wherein a distance between the first and second circuit boards is greater than 0.5*length (Lhousing) of the electronic device housing.

Embodiment 13 is the electronic device of any of the preceding embodiments, wherein the third circuit board has a stiffness that is relatively greater in a middle region and relatively lower at opposite end regions.

Embodiment 14 is the electronic device of any of the preceding embodiments, wherein the third circuit board includes first and second connectors at opposite end regions connected to respective connectors of the first circuit board and the second circuit board.

Embodiment 15 is the electronic device of any of the preceding embodiments, wherein the first and second connectors each include at least one board-to-board connector and at least one micro-coaxial connector.

Embodiment 16 is an electronic device, comprising: an electronic device housing having a major planar face; a first printed circuit board oriented parallel to the major planar face, the first printed circuit board including a speaker, front facing camera, proximity sensor, microphone, and camera flash; a second printed circuit board oriented parallel to the major planar face and separated from the first printed circuit board by a distance, the second printed circuit board including an electrical connector, an audio connector, a microphone, and a vibrator; a third printed circuit board electrically connected with the first and second circuit boards, at least a portion of the third circuit board oriented both perpendicular to the major planar face and between the first and second circuit boards; and a battery a least partially surrounded by the first circuit board, the second circuit board, and the third circuit board on at least three sides; wherein the first circuit board, the second circuit board, and the third circuit board together extend along an entire length ($L_{housing}$) of the electronic device housing, and the first circuit board and the second circuit board each extend across an entire width ($W_{housing}$) of the electronic device housing.

Embodiment 17 is the electronic device of embodiment 16, wherein the third circuit board is oriented perpendicular to the major planar face over the entire distance.

Embodiment 18 is the electronic device of embodiments 16 or 17, wherein the distance between the first and second circuit boards is greater than 0.5*length ($L_{housing}$) of the electronic device housing.

Embodiment 19 is a method of manufacturing an electronic device, comprising: connecting a first circuit board and a second circuit board with a third circuit board, the third circuit board having major faces perpendicular to major faces of the first and second circuit boards; securing the first circuit board, the second circuit board, and the third circuit board to an electronic device housing; positioning a battery in a space within the electronic device housing defined by the first circuit board, the second circuit board, and the third circuit board.

Embodiment 20 is the method of embodiment 19, wherein the connecting step comprises connecting at least one board-to-board connector and at least one micro-coaxial connector.

These and other embodiments described herein may provide one or more of the following benefits. First, some configurations described herein allow an electronic device to be smaller. Arranging a third circuit board perpendicular to first and second boards that it connects between can facilitate positioning of larger or additional components within the electronic device housing. For example, a circuit board configuration having circuit boards arranged perpendicular to one another can facilitate positioning of relatively large components, such as a battery, within the electronic device housing in a space-efficient manner.

Second, circuit board arrangements described herein, such as circuit boards arranged parallel to a thickness of an electronic device, can provide flexibility in arranging and assembling other components within the electronic device. For example, a circuit board arrangement parallel to a thickness of an electronic device can provide robust connection with a user input (e.g. button, switch, etc.) on a sidewall of the electronic device housing, and/or facilitate positioning of larger or additional components within the electronic device housing.

Third, circuit board arrangements described herein can improve the usable time of an electronic device between charges by accommodating a battery having a larger volume. For example, orienting a circuit board perpendicular to a major face of the battery may allow the battery to have a relatively larger width and a higher power capacity than if the circuit board were parallel to the major face of the battery.

Fourth, circuit board arrangements described herein may increase flexibility in manufacturing and assembly of an electronic device. For example, first, second, and third circuit boards can be assembled with each other and other components of the electronic device in a desired sequence. An independent third circuit board may be connected with first and second circuit boards before or after the first and second circuit boards are positioned within the electronic device housing.

The details of one or more embodiments are set forth in the accompanying drawings and the description below. Other features and advantages will be apparent from the description and drawings, and from the claims.

DESCRIPTION OF THE DRAWINGS

The details of one or more embodiments are set forth in the accompanying drawings and the description below, and wherein.

DETAILED DESCRIPTION OF ILLUSTRATIVE EMBODIMENTS

Figure 1:
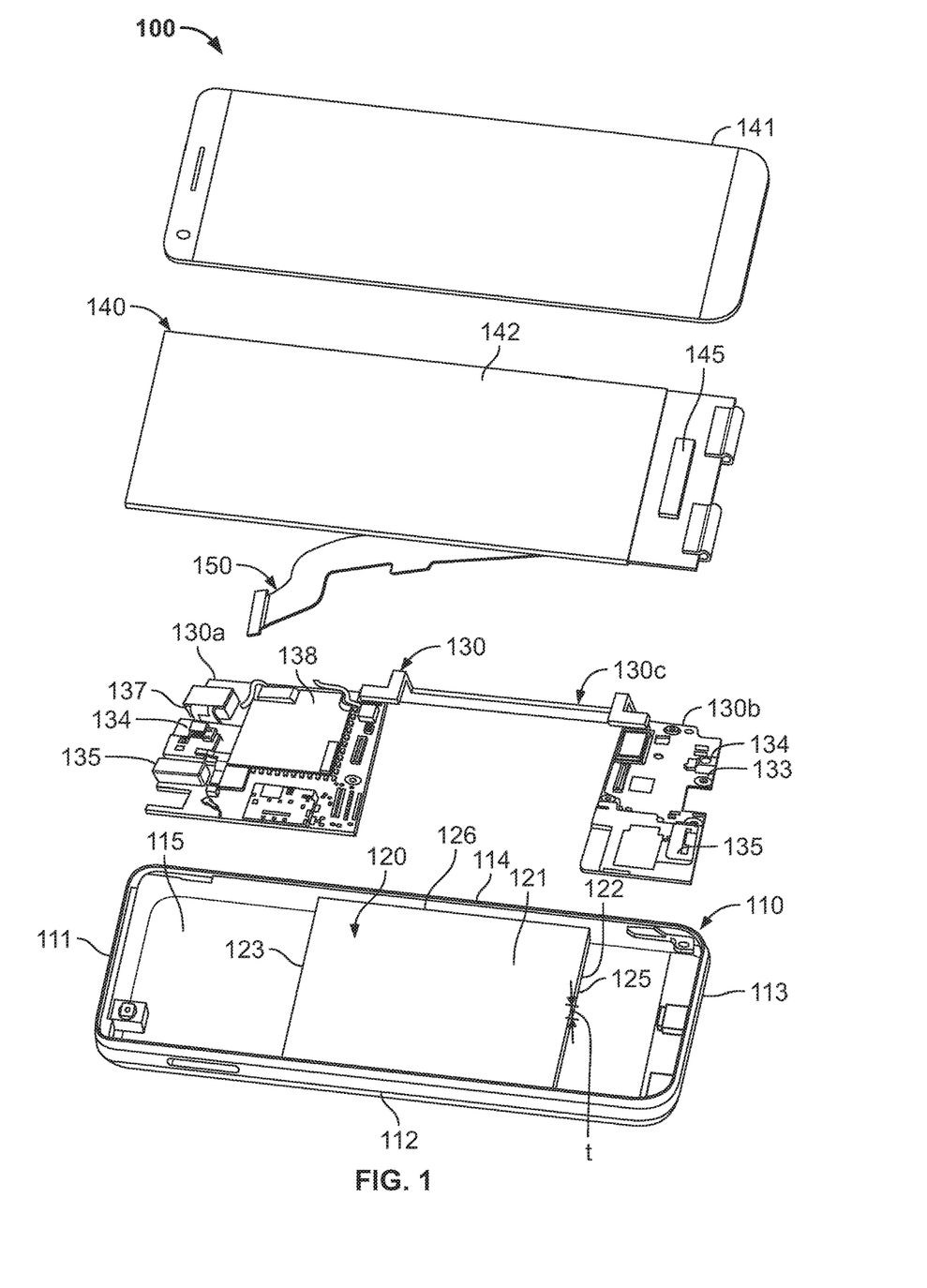
FIG. 1 is a perspective exploded view of an electronic device having first and second circuit boards connected by a third circuit board.

Referring to FIG. 1, an example electronic device 100 is shown, including an electronic device housing 110, battery 120, circuit board 130 and a display assembly 140. Circuit board 130 includes first, second, and third circuit boards 130a, 130b, 130c, that electrically connect various components of electronic device 100. First and second circuit boards 130a, 130b, are connected with third circuit board 130c, which is oriented perpendicular (e.g., substantially perpendicular within 10° of exactly perpendicular) to first and/or second circuit boards 130a, 130b, in some embodiments. Third circuit board 130c electrically connects first and second circuit boards 130a, 130b in a space-efficient manner such that larger or additional components can be accommodated within electronic device housing 110 with first, second, and/or third circuit boards 130a, 130b, 130c than if other circuit board architectures were employed.

Electronic device 100 may be an electronic device including a display, such as a mobile phone, music player, tablet, laptop computing device, wearable electronic device, data storage device, display device, adapter device, desktop computer, or other electronic device.

Electronic device housing 110 may be a bucket-type enclosure having first, second, third, and fourth side portions 111, 112, 113, 114 that define outer sidewalls of electronic device 100, and a major planar face 115 integrally attached with side portions 111, 112, 113, 114. A bucket-type enclosure allows components of electronic device 100 to be accommodated within housing 110 and enclosed by an outer cover, such as outer cover 141. In other embodiments, one or more side portions 111, 112, 113, 114, and/or back major planar face 115 may be formed separately and subsequently joined together (e.g., with one or more adhesives, welds, snap-fit connectors, fasteners, etc.) to form electronic device housing 110. In various embodiments, electronic device housing 110 may be an H-beam type housing or other electronic device housing 110 that includes one or more walls that provide a housing to at least partially support and/or enclose components of electronic device 100.

Electronic device housing 110 is made from a material that provides adequate structural rigidity to support and protect internal components of electronic device 100. In some embodiments, electronic device housing 110 is formed from a single piece of metal. Electronic device housing 110 may be milled, molded, forged, etched, printed, or otherwise formed. Alternatively or additionally, electronic device housing 110 may be formed from plastic, glass, wood, carbon fiber, ceramic, combinations thereof, and/or other materials.

Electronic device housing 110 and an outer cover 141 define an interior volume that can house various components of electronic device 110, including battery 120, circuit board 130, and display assembly 140. Electronic device housing 110 can accommodate additional components of electronic device 100, such as microphone 133, speaker 134, sensors 135, such as fingerprint sensors, proximity sensors, accelerometers, and/or other sensors, camera assembly 136, flash devices 137, processor 138, antennas, and/or other components. In various embodiments, some or all of these components may be electrically connected with circuit board 130.

Display assembly 140 provides a user interface display that displays information to a user. For example, display assembly 140 may provide a touch screen display that a user can interact with to view displayed information and to provide input to electronic device 100. In some embodiments, display assembly 140 occupies substantially all or the majority of a front major face 116 of electronic device 100 (e.g., and covers battery 120 and first, second, and third circuit boards 130a, 130b, 130c), and includes a rectangular visible display.

Display assembly 140 includes one or more substrate layers that provide the visible display and/or allow display assembly 140 to receive touch input from a user. For example, outer cover 141 may serve as an outermost layer that encloses other components of display assembly 140 and electronic device 100 and that a user may physically touch to provide input to electronic device 100. In some embodiments, display assembly 140 includes a liquid crystal display (LCD) panel 142 including a liquid crystal material positioned between one or more color filter and thin-film-transistor (TFT) layers. The layers of display panel 142 may include substrates formed from glass or polymer, such as polyamide. In various embodiments, display assembly 140 may be a light-emitting diode (LED) display, an organic light-emitting diode (OLED) display, such as an active-matrix organic light-emitting diode (AMOLED) display, a plasma display, an electronic ink display, or other display that provides visual output to a user.

Display assembly 140 includes driver circuitry used to control display output and/or receive user input. In some embodiments, driver circuitry includes a display integrated circuit 145 that is mounted in electrical communication with the TFT layers of display panel 142, for example by gate lines or other electrical connection. Display integrated circuit 145 may receive display data from processor 138, for example, and deliver corresponding signals to control the optical properties of a liquid crystal layer, for example, to produce a visible output.

Connection between display integrated circuit 145 and circuit board 130 (and processor 138, for example) may be provided by an electrical conductor that facilitates a robust electrical connection while maintaining a low profile configuration that does not significantly increase the overall dimensions of electronic device 100. In some embodiments, a flex conductor 150 connects display integrated circuit 145 and circuit board 130. Flex conductor 150 includes conductive structures on a thin, flexible substrate. Flex conductor 150 has a relatively thin profile and may be bent along a longitudinal direction to fit between various components of electronic device 100, such as to connect from a front face of a display substrate to circuit board 130 by passing between battery 120 and a rear of display assembly 140.

Flex conductor 150 may be connected between first circuit board 130a (e.g., a top circuit board) or second circuit board 130b (e.g., a bottom circuit board). Alternatively or additionally, further electrical communication between display assembly 140 and the other of first circuit board 130a or second circuit board 130b is provided via third circuit board 130c.

Components of display assembly 140 and flex conductor 150 may be positioned within electronic device 100 such that the space required to connect display assembly 140 with circuit board 130 is reduced. In some embodiments, display integrated circuit 145 may be positioned at a bottom of display substrate 142 (e.g., a portion of display substrate 142 close to bottom wall 113) and flex conductor 150 wraps around a back side of display substrate 142 to connect with first and/or second circuit boards 130a, 130b. In some embodiments, display integrated circuit 145 may be positioned at a top of display substrate 142 (e.g., a portion of display substrate 142 close to top wall 111) and flex conductor 150 wraps around a back side of display substrate 142 to connect with first and/or second circuit boards 130a, 130b. In some embodiments, display integrated circuit 145 may be positioned along a side of display substrate 142 (e.g., a side portion of display substrate 142 close to sidewall 112 or sidewall 114) and flex conductor wraps around a back side of display substrate 142 to connect with first and/or second circuit boards 1301, 130b. In some embodiments, display integrated circuit 145 and flex conductor 150 are positioned so that flex conductor 150 does not extend between display assembly 140 and battery 120. Positioning the battery 120 directly adjacent display assembly 140 (e.g., without an intervening electrical conductor 150 passing between battery 120 and display assembly 140) facilitates an increased battery size having a greater power capacity.

Conductive structures of flex conductor 150 may include conductive lines, printed conductive traces, or other conductive components that provide electrical connection between respective electrical contacts associated with display integrated circuit 145 and circuit board 130. Flex conductor 150 may be a single, double, or multi-layer flexible printed circuit including a polyamide, PEEK, polyester, having printed or laminated conductive elements, for example. Such construction provides robust electrical characteristics that can provide reliable connection between various components while having a low bending radius to facilitate compact arrangement of flex conductor 150 within electronic device 100.

Battery 120 is positioned within electronic device housing 110. In some embodiments, battery 120 is positioned substantially centrally and/or towards a bottom region of electronic device housing 110 that may promote a user's perception of stability when electronic device 100 is handled. For example, battery 120 may be positioned adjacent to first, second, and/or third circuit boards 130a, 130b, 130c such that battery 120 is positioned substantially centrally between top and bottom sidewalls 111, 113. In other embodiments, battery 120 may be positioned in a stacked configuration such that circuit boards 130a and/or 130b are between battery 120 and display assembly 140 (e.g., sandwiched between battery 120 and display assembly 140), or vice versa.

Battery 120 provides a primary source of power for electronic device 100 and its components. Battery 120 may include a secondary cell, rechargeable battery configured for use through thousands of battery charging cycles over the entire useful life of electronic device 100, for example. In various embodiments, battery 120 may be a lithium polymer battery, lithium ion battery, nickel metal hydride battery, nickel cadmium battery, or other battery type configured to power electronic device 100 over many charging cycles. Alternatively or additionally, battery 120 may include a primary cell battery configured to be replaced when substantially discharged.

Battery 120 is shaped to provide a desired power capacity in a space-efficient configuration. In some embodiments, battery 120 has front and back major planar faces 121, 122 separated by minor sides 123, 124, 125, 126 defining a thickness ($t_{thickness}$) of battery 120. For example, sides 123, 125, may be parallel to top and bottom sidewalls 111, 113 of electronic device housing 110, and extend substantially across a width of electronic device housing 110, such as more than 50%, more than 75%, or more than 90% of the width of electronic device housing. Such a configuration promotes a relatively high power capacity for a battery having a particular power density.

Circuit board 130 is configured to accommodate components of electronic device 100 in a space-efficient manner, and provide robust mechanical and electrical connections between these components. Circuit board 130 may support and/or electrically connect one or more components of electronic device 100 such as one or more of battery 120, microphone 133, speaker 134, sensors 135, camera assembly 136, flash devices 137, processor 138, electrical connectors (e.g., USB connectors, audio connectors, etc.), antenna lines, and/or other components. In some embodiments, circuit board 130 includes first circuit board 130*a* positioned at a top region of electronic device housing 110, second circuit board 130*b* positioned at a bottom region of electronic device housing 110. Third circuit board 130*c* connects the first and second circuit boards 130*a*, 130*b*. First, second, and third, circuit boards 130*a*, 130*b* may be separately formed circuit boards and may be electrically connected by an electrical conductor. In other embodiments, first and second circuit boards 130*a*, 130*b* are integral (e.g. integrally formed as a unitary circuit board) with third circuit board 130*c* extending between first and second circuit boards 130*a*, 130*b*. First, second, and/or third circuit boards 130*a*, 130*b*, 130*c* may be printed circuit boards, flexible circuit boards, other circuit board types, and/or combinations thereof.

First and second circuit boards 130*a*, 130*b* may be positioned at top and bottom positions of electronic device housing 110 so that various components may be accommodated at top and bottom regions of the electronic device. For example, first circuit board 130*a* is positioned at a top region of electronic device housing 110 and may include components beneficially positioned at the top region. First circuit board 130*a* may accommodate components such as an earpiece assembly including a speaker, front facing camera, proximity sensor, antenna lines, a microphone configured to receive audio from the external environment that may be processed to provide noise cancellation, camera flash, diversity antenna, and/or other components. Second circuit board 130 is positioned at a bottom region of electronic device housing 110 and may include components beneficially positioned at the bottom region. Second circuit board may accommodate components such as an electrical connector (e.g., USB connectors, audio connectors, etc.), audio speaker, microphone to receive audio input from a user or the external environment, vibrator, and/or other components. Such positioning may promote functionality and usability of the components by a user of electronic device 100.

Third circuit board 130*c* may accommodate one or more other electrical components and/or electrically connect various components of first and second boards 130*a*, 130*b*. In some embodiments, third circuit board 130*c* includes one or more of a hall effects sensor, battery thermistor, magnetometer, or other electronic components. Third circuit board 130*c* may electrically connect processor 138, on first circuit board 130*a*, for example, with the components of second circuit board 130*b*. In some embodiments, circuit board 130*c* provides the only electrical connection between first and second circuit boards 130*a*, 130*b*. Electronic device 100 may not include a flex conductor, for example, extending over battery 120 between first and second circuit boards 130*a*, 130*b*, and may not include a flex conductor extending over battery 120 (e.g., between battery 120 and display assembly 140) at all.

Third circuit board 130*c* has a vertical orientation (e.g., substantially vertical within 10° of exactly vertical) such that third circuit board 130*c* is oriented perpendicular to first and second circuit boards 130*a*, 130*b*. First and second circuit boards 130*a*, 130*b* have major faces that are arranged perpendicular with back major planar face 115 of electronic device housing 110. Third circuit board 130*c* is oriented perpendicular to the back major planar face 115. Orienting third circuit board 130*c* perpendicular to the back major planar face 155 reduces the dimensions that third circuit board 130*c* occupies in an x-direction (e.g., across the width if the electronic device). For example, the major faces of third circuit board 130*c* are oriented parallel to sidewalls 112, 114 of electronic device housing 110 while the major faces of first and second circuit boards 130*a*, 130*b* are oriented parallel to the back major planar face 115 of electronic device housing 110.

Additional space is available within electronic device 110, particularly in an x-direction, as a result of orienting third circuit board 130*c* in a vertical orientation and may be used to accommodate other components within electronic device housing 110. For example, electronic device housing 110 may accommodate a relatively large battery 120 as a result of vertically-orienting third circuit board 130*c*. In some embodiments, battery 120 occupies substantially an entire space between first and second circuit boards 130*a*, 130*b*, and between sidewall 112 and vertically-oriented third circuit board 130*c*. Battery 120 may also occupy an entire space between back major planar face 115 of electronic device housing 110 and a rear-most portion of display assembly 140. As a result, battery 120 can have a relatively larger volume and power capacity such that electronic device 100 can operate for a longer period of time between charges.

Third circuit board 130*c* may include one or more user inputs, such as a button or switch, that may be operated by user input along sidewall 114 of electronic device housing 110. For example, a user-actuatable button may be mounted on a major face of third circuit board 130*c* oriented vertically (e.g., perpendicular to major faces of first and second circuit boards 130*a*, 130*b*). A user may actuate the button by pressing inwards along sidewall 114 of electronic device 110 such that the axis of actuation is perpendicular to the major face of third circuit board 130*c*. Such a configuration can promote a robust electrical connection that can be reliably actuated through thousands of cycles without failure. Actuating in the direction of the circuit board can reduce the actuation force that could be placed on electrical connections between the button and third circuit board 130*c*, for example.

The material type, thickness, and number of layers of circuit board 130 may be selected to provide desired properties. For example, the substrate layers and electrical trace layers of first, second and third circuit boards 130a, 130b, 130c can be selected to affect the mechanical stiffness, insulating characteristics, and electrical impedance, for example, of the boards. In various embodiments, first, second, and/or third circuit boards 130a, 130b, 130c include substrate layers made from FR-2 phenolic paper, FR-3 cotton paper, FR-4 epoxy resin-impregnated woven fiberglass, metal core board, polytetrafluoroethylene, polyimide, polyamide, combinations thereof, and/or other materials. The materials and characteristics of one or more conductive layers, such as conductive traces, can be selected based on mechanical and/or electrical properties. For example, the material and thickness of a conductive trace layer may be selected to provide a desired electrical impedance.

In some embodiments, the material layers and characteristics of first, second, and third circuit boards 130a, 130b, 130c may differ from each other, and may be individually selected based on the configuration of electronic components of first, second, and third circuit boards 130a, 130b, 130c. For example, characteristics of third circuit board 130c may be selected independent of characteristics of first and/or second circuit boards 130a, 130b. Independent design and configuration of first, second, and/or third circuit boards 130a, 130b, 130c may be facilitated by forming the boards separately and subsequently connecting the boards (e.g., during manufacturing of electronic device 100). In some embodiments, third circuit board 130c is relatively thinner (e.g., has fewer substrate and conductive layers), than first and/or second circuit boards 130a, 130b, and/or includes conductive traces having thicknesses and resistances that differ from conductive traces of first and second circuit boards 130a, 130b. Separately formed and assembled first, second, third circuit boards 130a, 130b, 130c, can thus further reduce the overall space required by circuit board 130, and may promote flexibility in accommodating other components within electronic device housing 110.

First, second, and third circuit boards 130a, 130b, 130c, are sized to fit within electronic device 100 and accommodate the desired electronic components. In some embodiments, the first, second, and third circuit boards have different sizes (e.g., different usable surface areas). First circuit board 130a is larger than second and third boards 130b, 130c, and second circuit board 130b is larger than third circuit board 130c.

Figure 2:
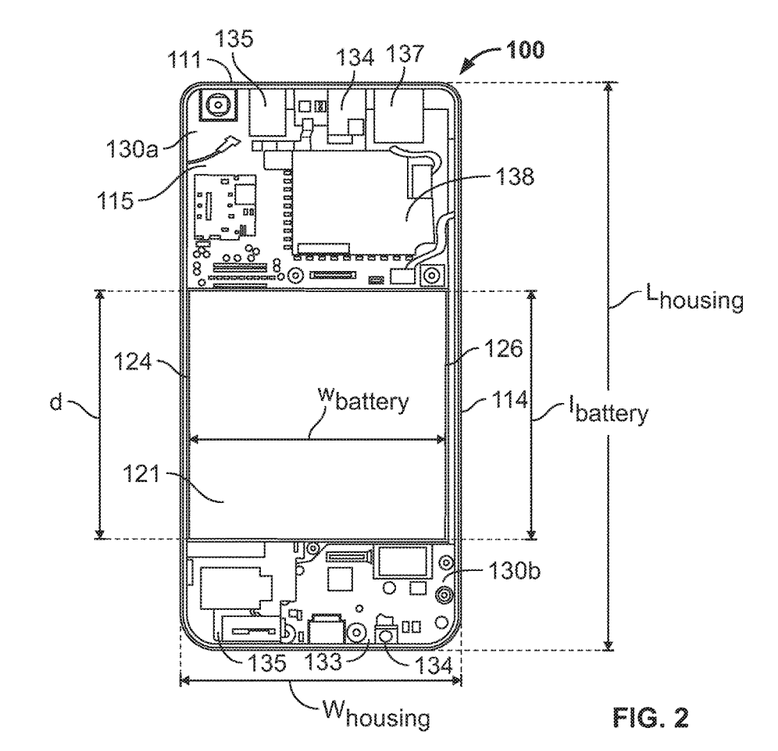
FIG. 2 is a front view of the electronic device of FIG. 1.

Referring to FIG. 2, first and second circuit boards 130a, 130b, are fixedly positioned within electronic device housing 110 and separated by a distance (d). Third circuit board 130c extends partially or completely between first and second circuit boards 130a, 130b. In some embodiments, third circuit board 130c extends between first and second circuit boards 130a, 130b and spans distance (d). For example, third circuit board 130c has a length ($l_{board}$) between first and second opposite end regions 171, 172. Length ($l_{board}$) may be at least substantially equal to distance (d) such that third circuit board can span distance (d) and provides electrical connection between first and second circuit boards 130a, 130b. In some embodiments, length ($l_{board}$) is greater than distance (d). For example, third circuit board 130c may be described as extending along or overlapping with portions of first and/or second circuit boards 130a, 130b (e.g., to facilitate electrical connection). Third circuit board 130c may be substantially planar along the entire distance (d) between first and second circuit boards 130a, 130b. In other embodiments, third circuit board 130c may include one or more bends or curves (e.g., to accommodate other electrical components or to facilitate connection with first and second circuit boards 130a, 130b) along distance (d) between first and second circuit boards 130a, 130b.

Distance (d) between first and second circuit boards 130a, 130b, may provide a space in which battery 120 is accommodated. Battery 120 has a length ($l_{battery}$) between minor sides 123, 125, (e.g., sides oriented parallel to top and bottom sidewalls 111, 113 of electronic device housing 110), and a width ($w_{battery}$) between minor sides 124, 126 (e.g., sides oriented substantially parallel to side portions 112, 114). In some embodiments, length ($l_{battery}$) is equal to distance (d) such that battery 120 occupies substantially the entire distance between first and second circuit boards 130a, 130b. Alternatively or additionally, there may be no electrical components between battery 120 (e.g., sidewalls of battery 120) and first, second, and/or third circuit boards 130a, 130b, 130c, respectively. Such a configuration allows battery 120 to accommodate a maximum distance between first and second boards 130a, 130b to improve the power capacity of battery 120. Alternatively or additionally, distance (d) may be greater than 50% of length ($L_{housing}$) of electronic device housing 110. Such relative dimensions provide a space for battery 120 that accounts for a significant portion of the interior volume of electronic device 100. Battery 120 may thus be relatively large and provide a relatively high power capacity and facilitate an extended period of time between charges.

Little or no space may exist between sidewalls of battery 120 and first, second, and/or third circuit board 130a, 130b, 130c. For example, a distance between sidewall 126 of battery 120 and third circuit board 130c may be less than 2.0 mm, less than 1.0 mm, less than 0.5 mm, less than 0.2 mm, or 0 (e.g., such that battery 120 is in contact with third circuit board 130a, 130b, 130c). Alternatively or in addition, a distance between sidewall 123 of battery 120 and first circuit board 130a may be less than 2.0 mm, less than 1.0 mm, less than 0.5 mm, less than 0.2 mm, or 0 mm, and a distance between sidewall 125 of battery 120 and second circuit board 130b may be less than 2.0 mm, less than 1.0 mm, less than 0.5 mm, less than 0.2 mm, or 0 mm. In some embodiments, a distance between sidewall 123 and first circuit board 130a is less than 1.0 mm, a distance between sidewall 125 and second circuit board 130b is less than 1.0 mm, and a distance between sidewall 126 and third circuit board 130c is less than 0.5 mm.

Distance (d) may provide a space within electronic device housing in which no electronic components are accommodated except battery 120. In some embodiments, only battery 120, and no other electrical components, are accommodated in a space surrounded by first, second, and third circuit boards 130a, 130b, 130c.

Electronic device housing 110 has a width ($W_{housing}$) between walls 112, 114 and a length ($L_{housing}$) between walls 111, 113. In some embodiments, width ($W_{housing}$) between walls 112, 114 is entirely occupied by battery 120 and third circuit board 130c at locations where battery 120 is present. For example, width ($w_{battery}$) may be slightly smaller than width ($W_{housing}$) such that third circuit board 130c can be accommodated between battery 120 and wall 114, for example. The relative sizes of electronic device housing 110, battery 120, and third circuit board 130c may allow third circuit board 130c to fit between battery 120 and wall 114 in a particular orientation (e.g., an orientation in which third circuit board 130c is parallel to battery side 126 and wall 114, or perpendicular to first and/or second circuit boards 130a, 130b.). In various embodiments, width ($w_{battery}$) is greater than 80%, greater than 85%, greater than 90%, greater than 95%, or greater than 98% of width ($W_{housing}$) of electronic device housing 110 between inner surfaces of walls 112, 114. Such relative dimensions can facilitate a battery 120 having a relatively large width ($w_{battery}$) while third circuit board 130c is oriented in a substantially vertical orientation between a minor battery side defining a thickness of battery 120 and wall 114 of electronic device housing 110.

First and second circuit boards 130a, 130b may extend across substantially the entire width ($W_{housing}$) of electronic device housing 110. Alternatively, first and second circuit boards 130a, 130b, and third circuit board 130c extend across substantially the entire width ($W_{housing}$) (e.g., in configurations in which third circuit board has a length ($l_{board}$) greater than a distance (d) between first and second circuit boards 130a, 130b). Circuit board 130 extends along substantially the entire length ($L_{housing}$) of electronic device housing 110. For example, first, second, and third boards 130a, 130b, 130c may together extend along substantially the entire length ($L_{housing}$) of electronic device housing 110.

Figure 3:
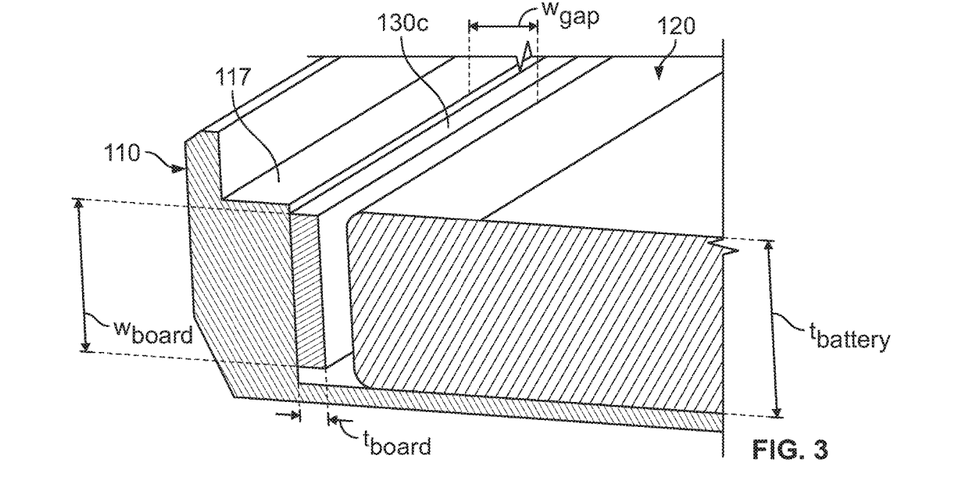
FIG. 3 is a cross-sectional perspective view of the electronic device of FIG. 1.

Referring to FIG. 3, a cross-sectional perspective view of an example electronic device 100 is shown, in which third circuit board 130c is positioned between an outer sidewall 114 of electronic device housing 110 and battery 120. Third circuit board 130c is oriented substantially vertically. For example, major surfaces of third circuit board 130c are oriented substantially parallel to outer sidewall 114 and battery side 124 such that third circuit board 130c extends along a thickness ($t_{battery}$) of battery 120, and may directly contact outer sidewall 114 and/or battery side 124 at particular locations (e.g., third circuit board may be substantially flush against outer sidewall 114 and/or battery side 124). A distance between battery 120 and electronic device housing 110 defines a gap having a width ($w_{gap}$). The width of the gap ($w_{gap}$) is sufficiently large to accommodate third circuit board 130c. In some embodiments, third circuit board 130c only fits within the gap in a substantially vertical orientation. For example, the width ($w_{board}$) is greater than the width of the gap ($w_{gap}$) such that third circuit board 130c would not fit between battery 120 and housing 110 if rotated to a substantially horizontal orientation, for example.

Electronic device housing 110 includes one or more engagement features that interact with display assembly 140. For example, electronic device housing 110 may include a ledge or shoulder 117 that display assembly 140 engages with. Display assembly 140 may be sealingly joined with electronic device housing 110 at shoulder 117 to enclose components within electronic device housing 110 and to prevent ingress of environmental contaminants such as water, dust, debris, and other foreign matter. In some embodiments, display assembly 140 includes a seal that interacts with a display panel 142 of display assembly 140 and a feature of electronic device housing 110. For example, seal may facilitate sealing engagement between shoulder 117 and an inner surface of display panel 142. Shoulder 117 may be integral to electronic device housing 110.

Third circuit board 130c is positionable within electronic device housing 110 below shoulder 117. For example, third circuit board 130c may be positionable entirely below shoulder 117 so that display assembly 140 can be at least partially supported by shoulder 117 above third circuit board 130c. The surface defined by the thickness ($t_{board}$) of third circuit board 130c is arranged parallel and/or substantially adjacent to shoulder 117. In some embodiments, the width ($w_{shoulder}$) of shoulder 117 is greater than the thickness ($t_{board}$) of third circuit board 130c, and/or third circuit board 130c may be at least partially nested below shoulder 117 (e.g., within a recess of wall 114 below shoulder 117). Such a configuration may provide a space-efficient configuration of third circuit board 130c that facilitates a relatively large battery 120.

The thickness ($t_{board}$) of third circuit board 130c may be less than the thickness ($t_{battery}$) of battery 120. In various embodiments, thickness ($t_{board}$) is between about 10% and 80%, 15% and 60%, or about 25% of thickness ($t_{battery}$) of battery 120.

Figure 4:
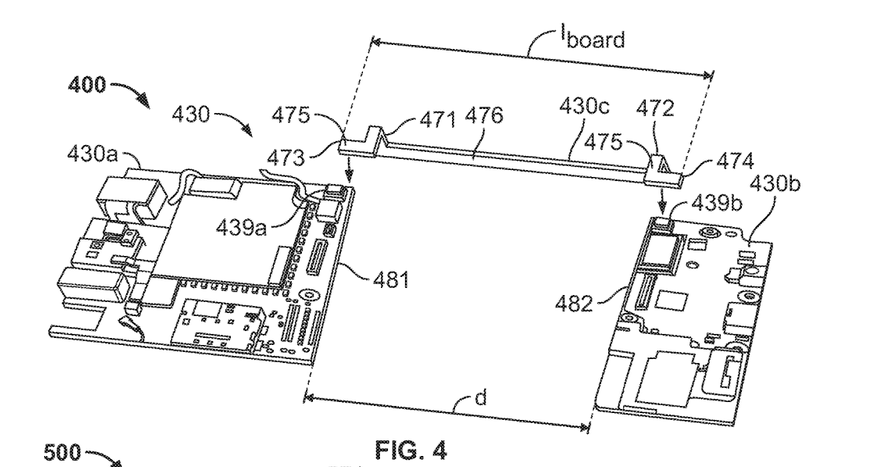
FIG. 4 is a perspective exploded view of another circuit board having first, second, and third circuit boards.

Referring to FIG. 4, an example circuit board 430 of an electronic device 400 is shown, including first, second and third circuit boards 430a, 430b, and 430c. In various embodiments, electronic device 400 and circuit board 430 may have features similar to electronic device 100 and circuit board 130, described herein. Circuit board 430 is positionable within an electronic device housing together with other components of electronic device 400.

First, second, and third circuit boards 430a, 430b, 430c, are separately formed and connected during a manufacturing operation. For example, third circuit board 430c may be connected with first and second circuit boards 430a, 430b such that at least a portion of third circuit board 430c between first and second circuit boards 430a, 430b is oriented substantially perpendicularly to first and second circuit boards 430a, 430b.

Third circuit board 430a includes first and second opposite end regions 471, 472 having first and second connectors 473, 474, respectively. First and second connectors are configured to connect with complementary connectors 439a, 439b of first and second circuit boards 430a, 430b. First and second connectors 473, 474 and complementary connectors 439a, 439b provide a secure electrical connection, and may include a board-to-board connector, zero insertion force (ZIF) connector, micro-coaxial connector, combinations thereof, and/or other connectors that provide a secure electrical connection.

First and second opposite end regions 471, 472 are configured such that third circuit board 430c may be positioned to connect between complementary connectors 473, 474 of first and second boards 430a, 430b. In some embodiments, first and second end regions 471, 472 include arm portions 475 that extend from a middle region 476. Arm portions may extend upwards and inwards, for example, including multiple bends (e.g., such as approximately 90° bends) so that first and second connectors 473, 474 can engage complementary connectors 439a, 439b.

In some embodiments, third circuit board 430c is configured to fit within the distance (d) separating first and second circuit boards 430a, 430b. For example, third circuit board has a length ($l_{board}$) that is long enough to connect the first and second circuit boards while a length of a vertically-oriented portion is less than or substantially equal to distance (d). First and second end regions 471, 472 extend over the top of first and second boards 430a, 430b, and/or a battery positioned between first and second boards 430a, 430b, from inner sides 481, 482, respectively, of first and second circuit boards 430a, 430b (e.g., sides separated by distance (d)). In this way, each of first, second, and third circuit boards 430a, 430b, 430c, may extend substantially to a side wall of a housing of electronic device 400 (e.g., each of first, second, and third circuit boards 430a, 430b, 430c, may be substantially flush with a housing sidewall along their length).

First and second end regions 471, 472 may be flexible such that first and second end regions 471, 472 can be bent into a desired position. Flexible end regions 471, 472 may facilitate positioning of first and second connectors 473, 474 for engagement with complementary connectors 439a, 439b. For example, first and second ends may be folded and/or twisted at one or more locations (e.g., folded upwards approximately 90° and folded inwards towards a complementary connector approximately 90° degrees) to align first and second connectors 473, 474 with complementary connectors 439a, 439b.

The material type and characteristics of the components of third circuit board 430c may be selected so that third circuit board 430c has a desired flexibility. For example, third circuit board 430c may have fewer or thinner substrate layers at locations of relatively higher flexibility, and have more or thicker substrate layers at locations of relatively lower flexibility. Alternatively or additionally, third circuit board 430c may be formed of different substrate types in middle region 476 and first and second end regions 471, 472. First and second end regions may be a flexible circuit (e.g., a flex circuit having a polyamide substrate), and middle region 476 may be formed of a relatively stiffer substrate. Accordingly, third circuit board 430c may have a variable stiffness that differs over the length of third circuit board 430c. A variable stiffness over the length of third circuit board 430c may facilitate connection with first and second circuit boards 430a, 430b, while providing a robust and durable circuit board.

In the example embodiment shown in FIG. 4, first and second connectors 473, 474 and complementary connectors 439a, 439b are oriented vertically such that third circuit board 430c may be connected through engagement in a vertical direction. For example, third circuit board 430c may be connected to first and second circuit boards 430a, 430b by lowering third circuit board 430c into engagement with first and second circuit boards.

The direction of engagement between third circuit board 430c, and first and second circuit boards 430a, 430b, may be selected to facilitate efficient manufacturing process and/or a sequence of manufacturing. In some embodiments, vertical engagement may facilitate connection of third circuit board 430c after assembly of first and second circuit boards 430a, 430b with other components of electronic device 400, such as after first and second circuit boards 430a, 430b are positioned in electronic device housing 110.

Figure 5:
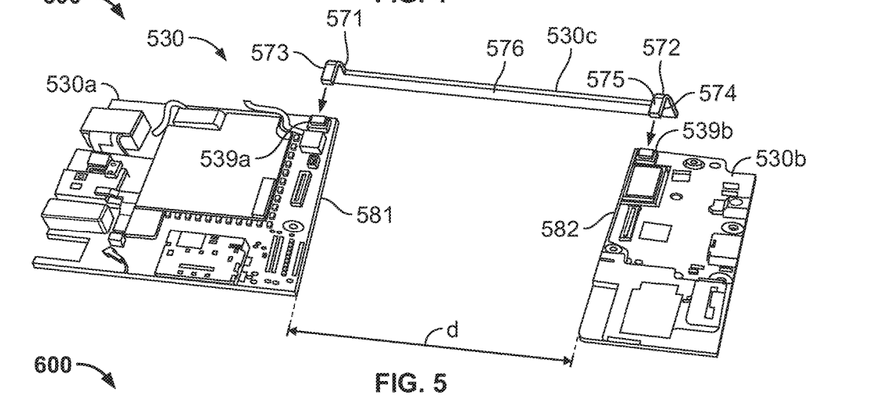
FIG. 5 is a perspective exploded view of another circuit board having first, second, and third circuit boards.

Referring to FIG. 5, an example circuit board 530 of an electronic device 500 is shown, including first, second and third circuit boards 530a, 530b, and 530c. In various embodiments, electronic device 500 and circuit board 530 may have features similar to electronic device 100 and circuit board 130, described herein. Circuit board 530 is positionable within an electronic device housing together with other components of electronic device 500.

First, second, and third circuit boards 530a, 530b, 530c, are separately formed and connected during a manufacturing operation. For example, third circuit board 530c may be connected with first and second circuit boards 530a, 530b such that at least a portion of third circuit board 430c between first and second circuit boards 530a, 530b is oriented substantially perpendicularly to first and second circuit boards 530a, 530b.

Third circuit board 530a includes first and second opposite end regions 571, 572 having first and second connectors 573, 574, respectively, configured to connect with complementary connectors 539a, 539b of first and second circuit boards 530a, 530b. First and second connectors 573, 574 and complementary connectors 539a, 539b provide a secure electrical connection, and may include a board-to-board connector, zero insertion force (ZIF) connector, micro-coaxial connector, combinations thereof, and/or other connectors that provide a secure electrical connection.

Third circuit board 530c has a length ($l_{board}$) that is greater than a distance (d) separating first and second circuit boards 530a, 530b. For example, a vertically-oriented portion of third circuit board 530c at least partially overlaps with first and/or second boards 530a, 530b (e.g., third circuit board 530c is between a wall of a housing of electronic device 500 and edges of first and/or second circuit boards 530a 530b). First and second end regions 571, 572 extend over the top of first and second boards 530a, 530b, and/or a battery positioned between first and second boards 530a, 530b, from outer sides 581, 582, respectively. In this way, a relatively large space between first, second, and third circuit boards 530a, 530b, 530c, is provided to accommodate a relatively large battery.

In the example embodiment shown in FIG. 5, first and second connectors 573, 574 and complementary connectors 539a, 539b are oriented horizontally such that third circuit board 530c may be connected through engagement in a horizontal direction. For example, third circuit board 530c may be connected to first and second circuit boards 530a, 530b by bringing circuit board 530c into engagement with first and second circuit boards 530a, 530b in a horizontal direction. In some embodiments, horizontal engagement may facilitate connection of third circuit board 530c with first and second circuit boards 530a, 530b, and connection of circuit board 500 as a unit with other components of electronic device 500.

Figure 6:
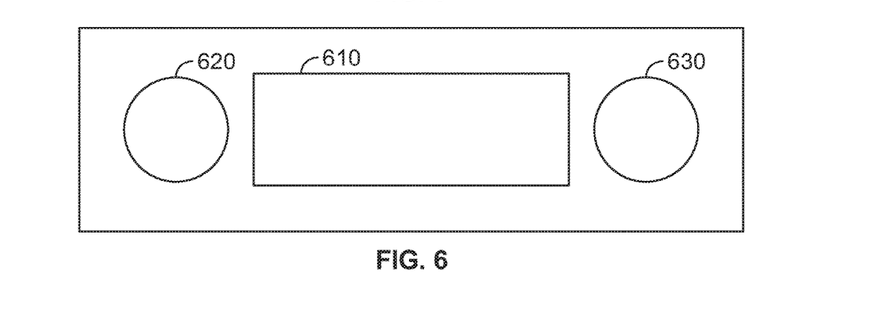
FIG. 6 is a plan view of an electrical connector.

Referring, to FIG. 6, an example connector 600 is shown that can be used to connect circuit boards, such as third circuit board 130c, 430c, 530c, with first and second circuit boards, such as first and second circuit boards 130a, 130b, 430a, 430b, 530a, 530c. Connector 600 includes a central connector 610 and side connectors 620, 630 spaced on each side of central connector 610 such that central connector 610 and side connectors 620, 630 are arranged in a row. In some embodiments, central connector 610 includes a board-to-board type connector and side connectors 620, 630 include micro-coax connectors. The board-to-board connector provides reliable and compact electrical connection. The micro-coax connector can serve to as retention pins, providing additional mechanical robustness to the connection.

Figure 7:
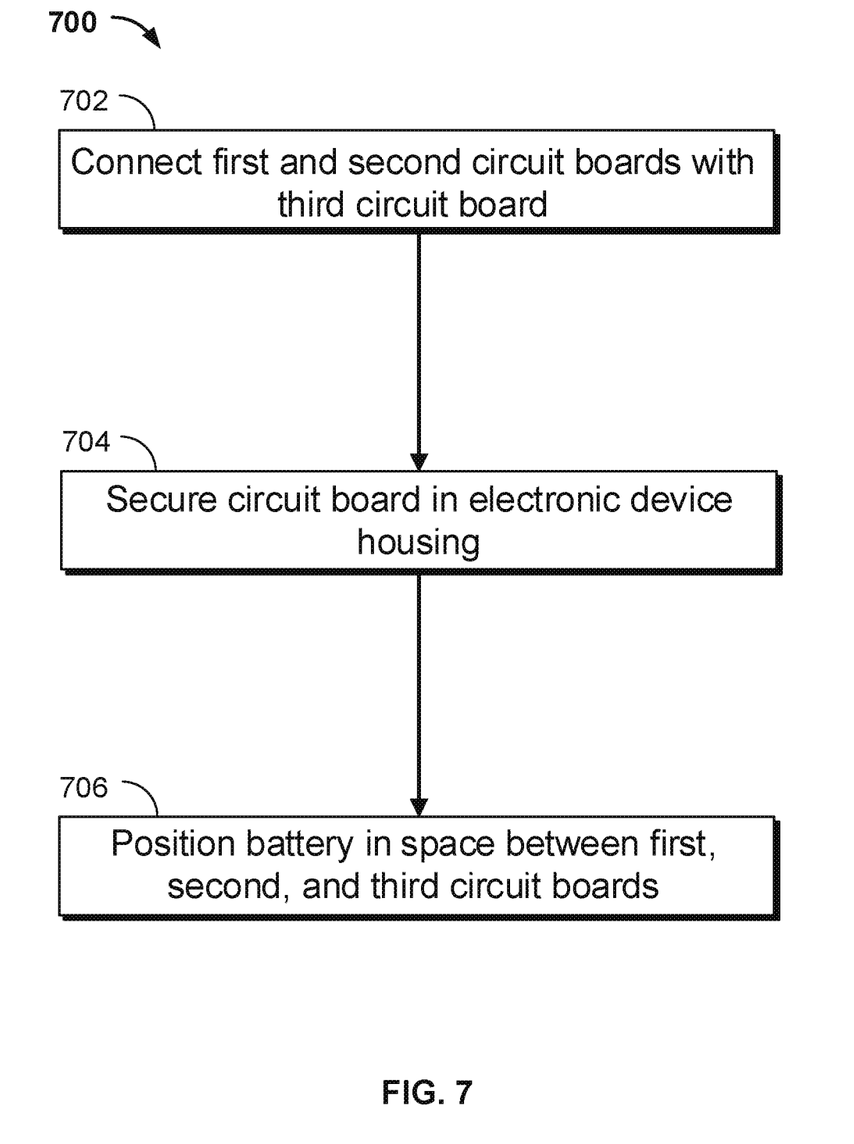
FIG. 7 is a flow diagram of a method of manufacturing an electronic device.

Referring to FIG. 7, a flow diagram of an example method 700 of manufacturing an electronic device is shown. In some embodiments, method 700 includes operation 702 of connecting first and second circuit boards (e.g., circuit boards arranged at top and bottom regions of the electronic device) with a third circuit board. For example, the third circuit board may be connected with the first and second circuit boards in a vertical orientation such that major faces of the third circuit board are oriented substantially perpendicular to major faces of the first and second circuit boards. The first, second and third circuit boards may be joined using one or more board-to-board connectors, zero insertion force connectors, micro-coax connectors, other connectors, and/or combinations thereof. In some embodiments, first and second circuit boards are connected to third circuit board by a board-to-board connector and two micro-coax connectors positioned on opposite sides of the board-to-board connector.

Method 700 further includes operation 704 of securing the circuit board in the electronic device housing. For example, the circuit board may be brought into engagement with one or more complementary features of the electronic device housing and fixed into position relative to the electronic device housing. The circuit board may be secured using one or more snap-fit connectors, adhesives, welds, or other fastening techniques.

Method 700 further includes operation 706 of positioning a battery in a space defined by the first, second, and third circuit boards. For example, first, second, and third circuit boards may define three sides of a substantially rectangular space that a battery may be accommodated in. In some embodiments, the battery is positioned to fill substantially the entire space between first and second circuit boards, and between a wall of the electronic device housing and the third circuit board.

Operations 702, 704, and 706 may be performed in any suitable order. In some embodiments, first, second, and third circuit boards, are connected in an initial manufacturing step before being assembled with the housing and the battery. In other embodiments, first, second, and/or third circuit boards may be individual secured with the electronic device housing. The first and second circuit boards may be fastened with the electronic device housing in an initial step, and the third circuit board may subsequently be connected with the first and second circuit boards. In some embodiments, the third printed circuit board may be installed within the electronic device housing before the first and second circuit boards. The first and second boards may then be connected with the third circuit board, followed by positioning of a battery and connection of the battery to a circuit board.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. An electronic device, comprising: an electronic device housing comprising:
   i) a planar face,
   ii) a first outer sidewall extending from the planar face, and
   iii) a second outer sidewall extending from the planar face;
   a first circuit board and a second circuit board, the first circuit board and the second circuit board each oriented parallel to the planar face of the electronic device housing;
   a third circuit board electrically connected to the first circuit board and the second circuit board, at least a portion of the third circuit board being oriented perpendicular to the planar face of the electronic device housing, parallel to the first outer sidewall, and parallel to the second outer sidewall; and a battery at least partially surrounded by the first circuit board on a first side of the battery, the second circuit board on a second side of the battery, and the third circuit board on a third side of the battery, wherein the first circuit board and the second circuit board are each fixedly positioned with respect to the electronic device housing and separated by a distance, and wherein the third circuit board is oriented vertically over at least half of the distance.

2. The electronic device of claim 1, wherein the at least a portion of the third circuit board is positioned between the first circuit board and the second circuit board.

3. The electronic device of claim 1, wherein the third circuit board is integral to the first circuit board, the third circuit board and the first circuit board constituting a unitary circuit board.

4. The electronic device of claim 2, wherein the first circuit board, the second circuit board, and the third circuit board integrally form a unitary circuit board.

5. The electronic device of claim 1, wherein the third circuit board is a printed circuit board.

6. The electronic device of claim 1, wherein the third circuit board is a flexible circuit.

7. The electronic device of claim 1, wherein the third circuit board is oriented vertically over the entire distance.

8. The electronic device of claim 1, wherein the battery has first and second major faces separated by sidewalls, and the first major face of the battery and the second major face of the battery are oriented parallel to the first circuit board and the second circuit board.

9. The electronic device of claim 1, wherein the electronic device housing includes a third outer sidewall and a fourth outer sidewall extending perpendicular from the planar face, the electronic device having a length between the third outer sidewall and the fourth outer sidewall of the electronic device housing.

10. The electronic device of claim 9, wherein a distance between the first and second circuit boards is greater than half the length of the electronic device housing.

11. The electronic device of claim 9, wherein the electronic device has a width between the first outer sidewall and the second outer sidewall, and the length of the electronic device is greater than the width of the electronic device.

12. The electronic device of claim 1, wherein the third circuit board has a stiffness that is relatively greater in a middle region and relatively lower at opposite end regions.

13. The electronic device of claim 1, wherein the third circuit board includes first and second connectors at opposite end regions connected to respective connectors of the first circuit board and the second circuit board.

14. An electronic device, comprising: an electronic device housing having:
   i) a planar face,
   ii) a first outer sidewall extending from the planar face, and
   iii) a second outer sidewall extending from the planar face;
   a first printed circuit board oriented parallel to the planar face of the electronic device housing, the first printed circuit board including a speaker, front facing camera, proximity sensor, microphone, and camera flash; a second printed circuit board oriented parallel to the planar face of the electronic device housing, the second printed circuit board including an electrical connector, an audio connector, a microphone, and a vibrator; a third printed circuit board electrically connected to the first and second circuit boards, at least a portion of the third circuit board being oriented perpendicular to the planar face of the electronic device housing, parallel to the first outer sidewall, and parallel to the second outer sidewall; and a battery a least partially surrounded by the first circuit board on a first side of the battery, the second circuit board on a second side of the battery, and the third circuit board on a third side of the battery, wherein the first circuit board and the second circuit board are each fixedly positioned with respect to the electronic device housing and separated by a distance, and wherein the third circuit board is oriented vertically over at least half of the distance.

15. The electronic device of claim 14, wherein the battery has first and second major faces separated by sidewalls, and the first major face of the battery and the second major face of the battery are oriented parallel to the first circuit board and the second circuit board.

16. The electronic device of claim 15, wherein the third circuit board is oriented perpendicular to the planar face of the electronic device housing over the entire distance.

17. A method of manufacturing an electronic device, comprising: connecting a first circuit board and a second circuit board with a third circuit board, the third circuit board having faces perpendicular to faces of the first and second circuit boards; securing the first circuit board, the second circuit board, and the third circuit board to an electronic device housing, the electronic device having a planar face, a first outer sidewall extending from the planar face, and a second outer sidewall extending from the planar face; and positioning a battery in a space within the electronic device housing defined by the first circuit board, the second circuit board, and the third circuit board; wherein the faces of the third circuit board oriented perpendicular to the faces of the first and second circuit boards are also oriented parallel to the first outer sidewall and oriented parallel to the second outer sidewall, wherein the first circuit board and the second circuit board are each fixedly positioned with respect to the electronic device housing and separated by a distance, and wherein the third circuit board is oriented vertically over at least half of the distance.

18. The method of claim 17, wherein the connecting step comprises connecting at least one board-to-board connector and at least one micro-coaxial connector.

\* \* \* \* \*